US007162378B2

(12) United States Patent
Hynds et al.

(10) Patent No.: US 7,162,378 B2
(45) Date of Patent: Jan. 9, 2007

(54) POINT OF PLAY TERMINAL

(75) Inventors: John P. Hynds, Washougal, WA (US); Dennis Antilla, Vancouver, WA (US)

(73) Assignee: J. & E. Hynds, LLC, Washougal, WA (US)

( * ) Notice: Subject to any disclaimer, the term of this patent is extended or adjusted under 35 U.S.C. 154(b) by 0 days.

(21) Appl. No.: 11/078,762

(22) Filed: Mar. 11, 2005

(65) Prior Publication Data

US 2006/0003619 A1 Jan. 5, 2006

Related U.S. Application Data

(60) Provisional application No. 60/553,592, filed on Mar. 12, 2004.

(51) Int. Cl.

| | |
|---|---|
| ***G01R 21/00*** | (2006.01) |
| ***G06F 11/30*** | (2006.01) |
| ***G06F 19/00*** | (2006.01) |

(52) U.S. Cl. ......................... 702/60; 702/122; 702/186

(58) Field of Classification Search .................. 702/60, 702/62, 122, 186; 439/188, 131, 842, 95, 439/517; 361/631, 643, 668, 669
See application file for complete search history.

(56) References Cited

U.S. PATENT DOCUMENTS 5,582,522 A * 12/1996 Johnson ...................... 439/214
5,689,242 A * 11/1997 Sims et al. ................. 340/652

* cited by examiner

*Primary Examiner*—Bryan Bui
(74) *Attorney, Agent, or Firm*—Kurt M. Rylander

(57) ABSTRACT

A point of play terminal includes a lockable outlet strip having one or more power sockets and an source of electric power, wherein the sockets can be selectively enabled with power, a computing device in electronic communication with said strip, wherein the computing device selectively enables power to individual sockets, and an access terminal in electronic communication with said computing device. A computer software driven process for allocating duration of allowed power use for individual power sockets based on identification data. An apparatus for allocating duration of allowed power use for individual power sockets based on identification data. An article including: a storage medium, the storage medium having instructions stored thereon for allocating duration of allowed power use for individual power sockets based on identification data, one or more enclosing walls, and a locking bar. A lockable electrical strip includes a power outlet strip base with a plurality of electrical outlet sockets on the top of said base, one or more locking rings, one or more enclosing walls, and a locking piece.

6 Claims, 16 Drawing Sheets

| | | | |
|---|---|---|---|
| Fig 9A | Fig 9B | Fig 9C | Fig 9D |
| Fig 9E | Fig 9F | Fig 9G | Fig 9H |

POINT OF PLAY TERMINAL

CROSS-REFERENCE TO RELATED APPLICATION

The present application claims the benefit of and priority to prior co-pending U.S. Provisional Patent Application Ser. No. 60/553,592 filed on Mar. 12, 2004.

FIELD OF THE INVENTION

The present invention relates to electrical outlets, and more particularly to programmable devices that control use of electrical outlets.

BACKGROUND

Today, in the typical home, children are spending more and more time indoors watching TV, playing on computers, playing on Play Stations, X-Box's, and other electronic entertainment gaming devices. Currently, it is very difficult for parents to oversee, let alone control these activities. Thus, there is a need for a device that provides user configurable control and configurable access to the electricity that such products require to function.

SUMMARY AND ADVANTAGES

A point of play terminal includes a lockable outlet strip having one or more power sockets and an source of electric power, wherein the sockets can be selectively enabled with power, a computing device in electronic communication with said strip, wherein the computing device selectively enables power to individual sockets, and an access terminal in electronic communication with said computing device. A computer software driven process for allocating duration of allowed power use for individual power sockets based on identification data. An apparatus for allocating duration of allowed power use for individual power sockets based on identification data. An article including a storage medium, the storage medium having instructions stored thereon for allocating duration of allowed power use for individual power sockets based on identification data, one or more enclosing walls, and a locking bar. A lockable electrical strip includes a power outlet strip base with a plurality of electrical outlet sockets on the top of said base, one or more locking rings, one or more enclosing walls, and a locking piece.

The present invention presents numerous advantages, including: (1) the ability to permit or decline power to one or more power outlet sockets; and (2) the ability to limit TV time, video game time, and other power usage times based on preset parameters. Additional advantages of the invention will be set forth in part in the description which follows, and in part will be obvious from the description, or may be learned by practice of the invention. The advantages of the invention may be realized and attained by means of the instrumentalities and combinations particularly pointed out in the appended claims. Further benefits and advantages of the embodiments of the invention will become apparent from consideration of the following detailed description given with reference to the accompanying drawings, which specify and show preferred embodiments of the present invention.

BRIEF DESCRIPTION OF THE DRAWINGS

FIG. 1 shows an overview of an embodiment of the present invention, showing a terminal, which includes a computing device, a lockable power strip and the remote outlet the lockable power strip will connect to.

DETAILED DESCRIPTION

Figure 1:
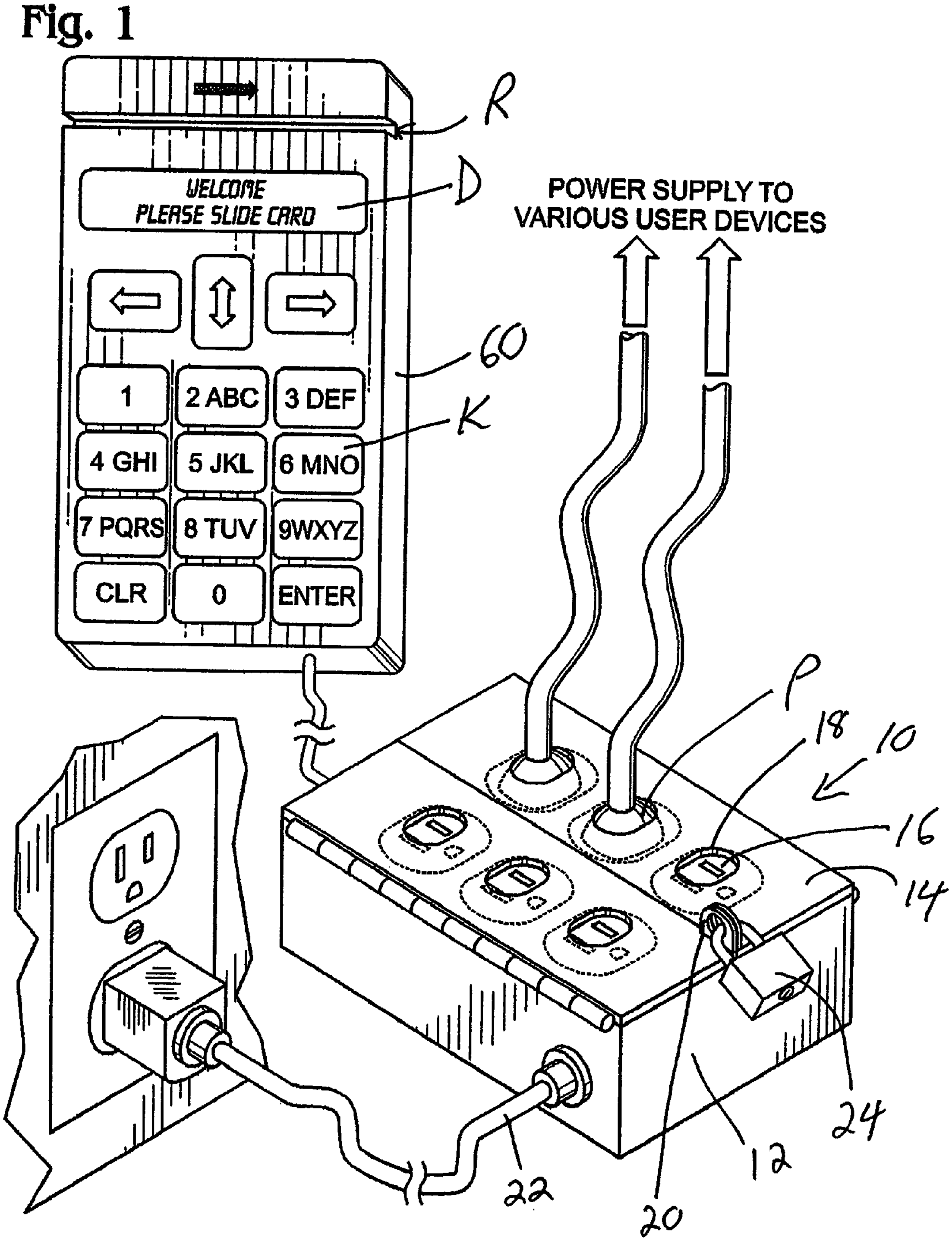

Before beginning a detailed description of the subject invention, mention of the following is in order. When appropriate, like reference materials and characters are used to designate identical, corresponding, or similar components in differing figure drawings. The figure drawings associated with this disclosure typically are not drawn with dimensional accuracy to scale, i.e., such drawings have been drafted with a focus on clarity of viewing and understanding rather than dimensional accuracy.

The present invention provides devices, methods, and processes for controlling power voltage application to specific power strip sockets.

The present invention may be implemented by one or more devices that include logic circuitry. The device performs functions and/or methods as are described in this document. The logic circuitry may include a processor that may be programmable for a general purpose, or dedicated, such as microcontroller, a microprocessor, a Digital Signal Processor (DSP), etc. For example, the device may be a digital computer like device, such as a general-purpose computer selectively activated or reconfigured by a computer program stored in the computer.

Moreover, the invention additionally provides methods, which are described below. The methods and algorithms presented herein are not necessarily inherently associated with any particular computer or other apparatus. Rather, various general-purpose machines may be used with programs in accordance with the teachings herein, or it may prove more convenient to construct more specialized apparatus to perform the required method steps. The required structure for a variety of these machines will become apparent from this description.

In all cases there should be borne in mind the distinction between the method of the invention itself and the method of operating a computing machine. The present invention relates both to methods in general, and also to steps for operating a computer and for processing electrical or other physical signals to generate other desired physical signals.

The invention additionally provides programs, and methods of operation of the programs. A program is generally defined as a group of steps leading to a desired result, due to their nature and their sequence. A program includes a writing which sets forth instructions which can direct the operation of an automatic system capable of storing, processing, retrieving, or transferring information. A program made according to an embodiment of the invention is most advantageously implemented as a program for a computing machine, such as a general-purpose computer, a special-purpose computer, a microprocessor, etc.

The invention also provides storage media that, individually or in combination with others, have stored thereon instructions of a program made according to the invention. A storage medium according to the invention is a computer-readable medium, such as a memory, and is read by the computing machine mentioned above.

The steps or instructions of a program made according to an embodiment of the invention requires physical manipulations of physical quantities. Usually, though not necessarily, these quantities may be transferred, combined, compared, and otherwise manipulated or processed according to the instructions, and they may also be stored in a computer-readable medium. These quantities include, for example electrical, magnetic, and electromagnetic signals, and also states of matter that can be queried by such signals. It is convenient at times, principally for reasons of common usage, to refer to these quantities as bits, data bits, samples, values, symbols, characters, images, terms, numbers, or the like. It should be borne in mind, however, that all of these and similar terms are associated with the appropriate physical quantities, and that these terms are merely convenient labels applied to these physical quantities, individually or in groups.

This detailed description is presented with aid of flowcharts, display images, algorithms, and symbolic representations of operations of data bits within at least one computer readable medium, such as a memory. An economy is achieved in the present document in that a single set of flowcharts is used to describe both methods of the invention, and programs according to the invention. Indeed, such descriptions and representations are the type of convenient labels used by those skilled in programming and/or the data processing arts to effectively convey the substance of their work to others skilled in the art. A person skilled in the art of programming may use these descriptions to readily generate specific instructions for implementing a program according to the present invention.

Often, for the sake of convenience only, it is preferred to implement and describe a program as various interconnected distinct software modules or features, individually and collectively also known as software. This is not necessary, however, and there may be cases where modules are equivalently aggregated into a single program with unclear boundaries. In any event, the software modules or features of the present invention may be implemented by themselves, or in combination with others. Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network, such as a local area network (LAN), or a global network, such as the Internet.

In the present case, methods of the invention are implemented by machine operations. In other words, embodiments of programs of the invention are made such that they perform methods of the invention that are described in this document. These may be optionally performed in conjunction with one or more human operators performing some, but not all of them. As per the above, the users need not be collocated with each other, but each only with a machine that houses a portion of the program. Alternately, some of these machines may operate automatically, without users and/or independently from each other.

The present invention may be implemented as computer software on a conventional computer system. Conventional computer systems include a processor which retrieves and executes software instructions stored in storage such as memory, which may be Random Access Memory (RAM) and may control other components to perform the present invention. Storage may be used to store program instructions or data or both. Storage, such as a computer disk drive or other nonvolatile storage, may provide storage of data or program instructions. In one embodiment, storage provides longer term storage of instructions and data, with storage providing storage for data or instructions that may only be required for a shorter time than that of storage. Input device such as a computer keyboard or mouse or both allows user input to the system. Output, such as a display or printer, allows the system to provide information such as instructions, data or other information to the user of the system. Storage input device such as a conventional floppy disk drive or CD-ROM drive accepts via input computer program products such as a conventional floppy disk or CD-ROM or other nonvolatile storage media that may be used to transport computer instructions or data to the system. Computer program product has encoded thereon computer readable program code devices, such as magnetic charges in the case of a floppy disk or optical encoding in the case of a CD-ROM which are encoded as program instructions, data or both to configure the computer system to operate as described below.

The present invention relates to a programmable device that controls a single or multi-port electrical outlet for the purpose of providing one or more users rights and privileges associated with specific identifying mechanisms whereby at user authorized request voltage can be applied or withdrawn to all or any socket on the outlet strip, based on pre-established criteria.

As shown in FIGS. 1–9H, a point of play terminal includes a lockable outlet strip 10 having one or more power sockets 16 and a source of electric power, wherein the sockets can be selectively provided with power, a computing device in electronic communication with said strip, wherein the computing device selectively provides power to individual sockets, and an access terminal 60 in electronic communication with said computing device. Those skilled in the art will understand that the computing device is preferably included within the access terminal 60 and has the schematic layout as shown in FIGS. 9A–9H, In the point of play terminal, the power strip 10 with a plurality of sockets 16 allows multiple electrical devices to be plugged into it and then the access to the plugs P would be restricted, locked or secured, so that an unauthorized person could not remove the plugs. In preferred embodiment, base 12 contains a plurality of outlet electrical X10 sockets, which are displayed on the topside of the box. These are standard electrical sockets, through which electricity can be provided to many household items.

As shown in FIGS. 1, 2, 3, and 9A–9H, a lockable power outlet strip 10, a terminal 60 to facilitate user access, and a computing device, see FIGS. 9A–9H, tie together and enhance the functionality of the power strip and the terminal. The power strip 10 allows multiple devices to be plugged into it and then the access to the plugs P can be restricted, locked or secured, so that an unauthorized person cannot remove the plugs P. The power strip 10 connects to a computing device, see FIGS. 9A–9H that has the ability to control each socket 16 on the strip, independently of the other sockets. This control allows voltage to be applied to a socket, or to have the voltage removed from the socket, as needed. The computing device, having a schematic as shown in FIGS. 9A–9H connects to a terminal 60 that allows the user to apply voltage, to one or many sockets 12, on the power strip 10, by using an access tool such as a PIN Code, Magstrip card, Biometric reader, or other such device, much like a point of sale terminal works. As shown in FIGS. 4–8, programming the computing device, FIGS. 9A–9H, entails identifying what devices are plugged into what specific outlet sockets and entering specific access-rights and parameters, and/or specific deny-rights and parameters, for each user, or group of users. The access/deny parameters could include year, month, date, day, time, hour, minutes and fractions thereof, in any combination thereof, for access to all, a combination of, or a specific outlet port. Once the device has been programmed and the users have received their access method, PIN Code, Magstrip card, Biometric specifics, et cetera, the user now has access to what could be termed "Credit" with the device. The actual use of the credit(s) is now up to the user, to choose how and when to use their credit(s) to apply voltage to the outlet port(s) associated with the device(s) of their choosing. Once the user has correctly implemented their established access tool, such as by entering a PIN, swiping a magnetic strip, placing a thumb on a biometric reader, or some other such access tool, via the terminal 60, the terminal interface would allow the user to choose which socket(s) 16 on the outlet strip 10 the user wants to have voltage applied to, and for what duration of time the socket 16 would receive the voltage. If the user request is not within the acceptable limits as defined by pre programming then the computing device will not allow voltage to be applied to the selected sockets. The user may then choose to request a differing amount of time or ports or combination thereof.

The access tool can be a PIN code that is typed into the terminal 60 using the key pad K or it can be an electronic device such as a Magstrip card slipped through a card reader R or Biometric reader or other similar apparatus known to those skilled in the art, which works in a fashion similar to a point of sale terminal.

As shown in FIG. 1, a lockable power outlet strip 10 preferably includes a power outlet strip base 12 having one or more power X10 sockets 16 which can receive standard electrical plug P, a power cord 22 connectable to a standard power supply, one or more enclosing walls 14 connected to said base which enclose the power strip, locking rings 20, and a locking piece 24 insertable through said locking rings to prohibit the enclosing walls from opening. Alternative embodiments of a lockable power outlet strip are shown in FIGS. 2, 3, 10, 11.

As shown in FIG. 1, the lockable power outlet strip 10, provided with a strip base 12, enclosing walls 14 which enclose over the sockets 16 to prohibit plugs P plugged into sockets from being removed, and one or more locking rings 20 protruding from the base 12. Enclosing walls 14 are preferably hinged metal walls, which hinge from opposite parallel edges of strip and over and meet in the center. Enclosing walls include access slots 18 through which the plug cords run. Preferably, access slots 18 are formed are circular and have sufficient diameter that non-plug end of an detachable electric cord can go through the slots, but have a diameter smaller than the size of a standard electrical plug to prevent the plug from being removed from within the closed enclosing walls. Enclosing walls are further provided with locking rings 20, one on each enclosing wall, as shown in FIG. 1. A locking mechanism, such as a pad lock or key lock 24 fits through the locking rings to prevent plugs that have been placed in the power strip sockets from being removed.

Figure 2:
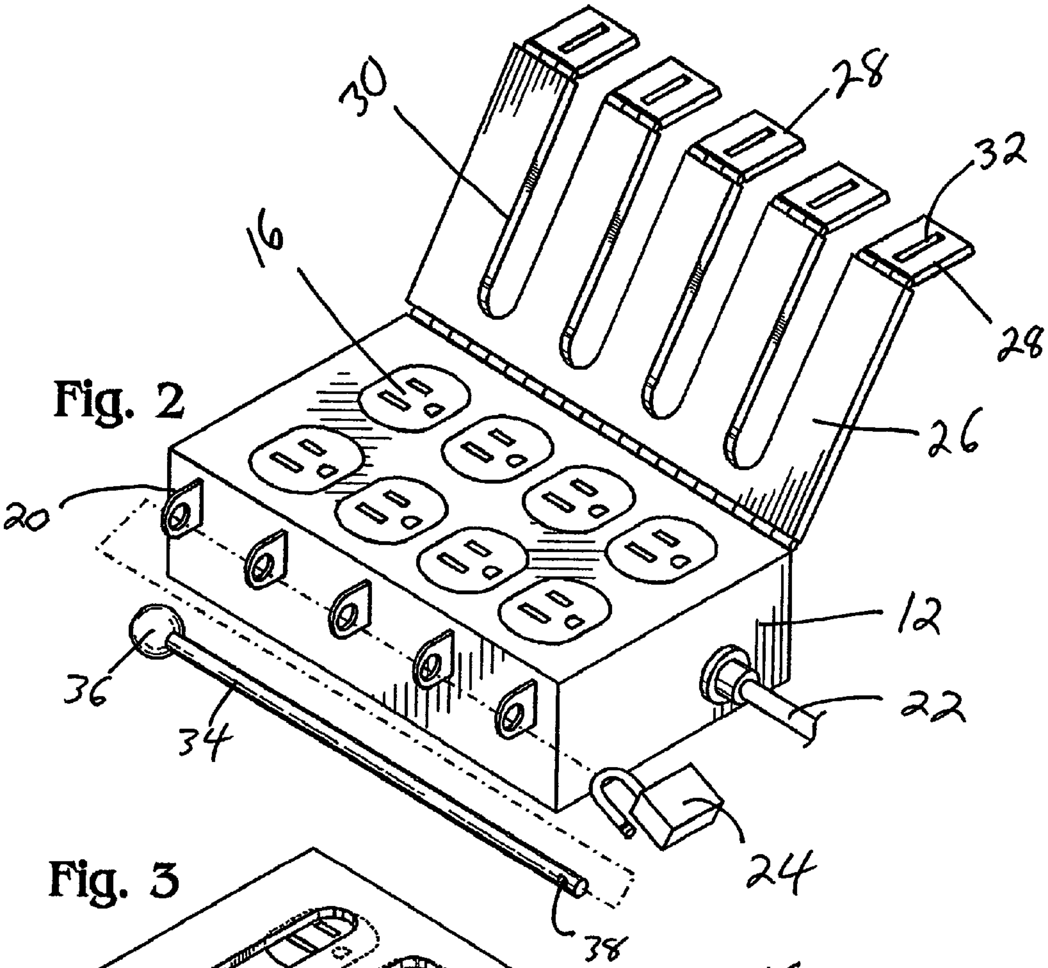
FIG. 2 shows a perspective view of a lockable power strip unlocked.
Figure 3:
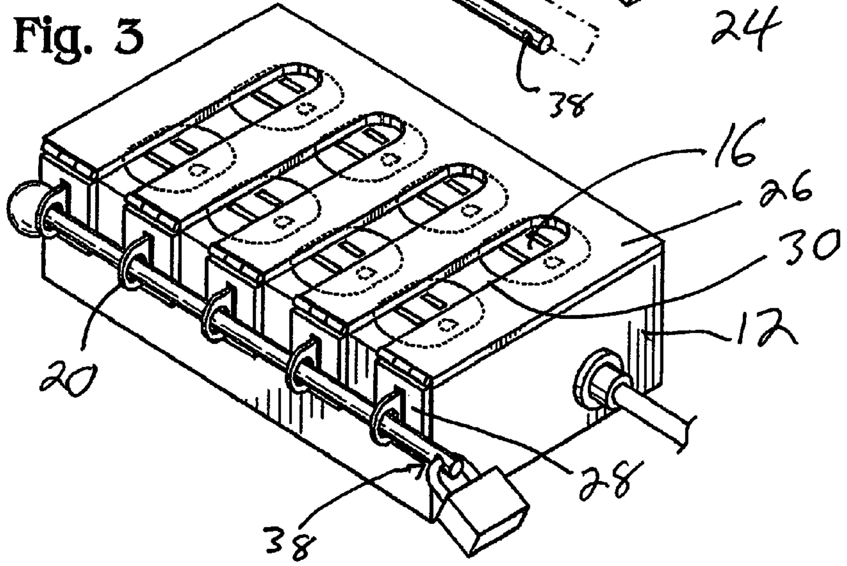
FIG. 3 shows another view of the lockable power strip of FIG. 2, locked.

Alternatively, as shown in FIGS. 2, 3, enclosing wall has a top portion 26 and one ore more side portions 28. The length and width of top portion is such that it substantially covers the top of the strip base 12. The top portion is provided with multiple transverse access slots 30, corresponding to and aligning over the sockets 16 on the top of the strip base 12. Each transverse access slot 30 is of great enough length to allow access to corresponding socket and of great enough width to allow passage of electrical cords but narrow enough to prevent removal a plug when the enclosing wall top portion is closed and locked. Enclosing wall side portions 28 hingeably attach to the enclosing wall top portion 26. Enclosing wall side portions 28 align with and correspond to top portion 26 to continue the transverse access slots. In each enclosing wall side portion 28 are a locking ring portals 32 matching and aligning with to receive the locking rings 20 which are provided on the side of the base 12. Locking ring portals 32 are of sufficient size so that locking rings 20 may pass completely through.

A locking bar 34 insertable through the locking rings 20, provided with a stop 36 on one end of said locking bar, and a locking passage 38 on the distal end of said locking bar. Locking bar 34 fits through the locking rings 2—once the locking rings are fitted through the locking ring portals 32. Stop 36 prevents locking bar 34 from passing completely through, and out of the locking rings 20. Locking bar 34 preferably has a locking passage 38 which allows locking piece 24, such as a pad lock or other suitable locking device known to those with skill in the art, to pass through the locking passage 38 to prevent the locking bar 34 from being pulled back through the locking rings 20. When the lockable power strip is locked plugs that have been placed in the power strip sockets cannot be removed.

Computing Device

The power strip 10 connects to a computing device having a schematic layout as shown in FIGS. 9A–9H, that has the ability to control each socket 16 on the strip 10, independently of the other sockets. This control allows voltage to be applied to a socket, or to have the voltage removed from the socket, as needed.

A computing device, see FIGS. 9A–9H, for allocating power to individual power sockets 16 connects to a terminal 60 that allows the user to apply the voltage to one or more sockets on the power strip by using an access tool. In preferred embodiment, the computing device runs on a HC12 semiconductor from Motorola U1.

A computer loaded with a set of instructions is provided for receiving identification data from a user, comparing the identification data with a user account database to determine amount of power usage allowed to the user, determining whether the user is allowed power usage, if the user is allowed power usage, then allowing the user to choose one or more power outlet sockets to power, monitoring the length in time of the power usage by the user, storing the elapsed time of power usage in the user account database, incrementing the elapsed session time to the total elapsed time for the user in the power usage database, declining further power usage when the aggregate lapsed time reaches certain predefined parameters, a lockable power outlet strip having one or more power sockets in electronic communication with said computer, and an access terminal in electronic communication with said computer.

An article is provided including a storage medium, the storage medium having instructions stored thereon, wherein when the instructions are executed by a machine, they result in receiving identification data from a user, comparing the identification data with a user account database to determine amount of power usage allowed to the user, determining whether the user is allowed power usage, If the user is allowed power usage, allowing the user to choose one or more power outlet sockets to power, monitoring the length in time of the power usage by the user, storing the elapsed time of power usage in the user account database, incrementing the elapsed session time to the total elapsed time for the user in the power usage database, and declining further power usage when the aggregate lapsed time reaches certain predefined parameters.

FIG. 9A–9H shows the electrical schematic drawing for the preferred embodiment of the computer device, utilizing a Motorola HC12 chip U1. In the preferred embodiment, the computer device is provided with integrated circuits U1, U2, U3, U4, U5, U6, U7, U8, U9, U10, and U11. In the preferred embodiment integrated circuits U5 and U6 are optional.

All signals to and from the main processor, U1, begin with the name or the input/output port pin followed by a generic function in the same name. Signals are described this way to facilitate the software development whereby the programmer can relate to the physical I/O pin signals to the register assignments of the processor architecture for developing the software algorithm of control.

In the design all external devices connected to U1 are addressed with serial communications and selections of the devices are via dedicated I/O pins for each device. In the preferred embodiment, the serial protocol is Motorola's serial peripheral interface ("SPI"). The SPI works with the all SPI compatible external devices. SPI is an industry standard for serial device communications. This method, over parallel methods, is chosen to ease the circuit board design so that minimum circuit traces are required thus reducing the density of the printed circuit board (PCB) also called a printed wiring board (PWB). The overall intent is to reduce noise (EMI) and cost in the manufacture of the PWB.

A standard power supply configuration is used. The voltages supplied are +5 volts, +12 volts and +24 volts unregulated. The +24 volts unregulated is used for the transmitter located at H-6. The +12 volts is used for programming U1 and the transmitter driver. The +5 volts supplies power for all the remaining devices.

U1 is the central core processor controlling all communications and signal generation. This processor contains an onboard 32K of flash program memory. Downloading the flash is done via a 6 pin header (connector). When the programming switch is switched to the +12 volt position all software is then downloaded into the unit. The switch is then returned to the +5 volt position. Preferably, the switch is a jumper pin so as not to have accidental programming occur in the field. When programming is completed the reset button at D-6 is depressed, resetting the unit to boot up and normal function occurs. U2 is a device that holds the reset! line low until VCC (+5V) is >4.75 volts assuring a successful start up. This is a normal power on sequence. At a power on condition U1 initializes all the external peripheral devices to a known state from it's internal EEPROM (electrical erasable programmable read only memory) which stores the user settings for U5, a serial interface for either RS-232 or Infrared (IR) communications, a realtime clock U3 and the user display at B-3.

Input devices include the Keypad, Magnet card reader, Infrared remote transceiver, U6 and U4, which generates a RS-232 level interface to a computer with a serial communication terminal program running over a standard RS-232 link. The keypad utilizes a 4×4 matrix which supplies an input to AN0 thru AN3 which decodes the depressed switch. Software decodes the 10 numbers into alpha numeric characters (ASCII) in the same method as used in cellular telephones. The magnetic card reader has a standard ASCII serial TTL communication. U8*a* and U8*b* are processor controlled switches and select the card reader or the external RS-232 communications. At boot time the default is RS-232 for diagnostics then switches to the card reader. The primary serial communication is done via U5 a MAX3100. The method of communications can be either RS-232 or IR communications to a standard IR remote controller or a standard PDA running a program like Chat which is used for PDA to PDA communications.

Output control signals are generated by U1 for the 120 KHz reference carrier and modulation control. Q1 and Q2 comprise a resonate driver to superimpose a 120 KHz sine wave pulse width modulated (PWM) signal on the AC line at the zero crossing. This PWM signal follows the specifications for control of the X-10 remote modules and provides a 5 Volt peak to peak signal into a five ohm impedance. The 120 KHz signal is modulated such that a 1 millisecond period of 120 KHz is equal to a logic one and no pulse period is a logic zero. All timing is synchronized to the line frequency by an optical coupler U8 which detects the AC line zero crossings where the PWM signal is then modulated. This is a period when the electrical line is the most quiet.

Programming

As shown in FIGS. 4–8, a computer software driven process for allocating duration of allowed power use for individual power sockets based on identification data includes receiving identification data from a user, comparing the identification data with a user account database to determine amount of power usage allowed to the user, determining whether the user is allowed power usage and if the user is allowed power usage then allowing the user to choose one or more power outlet sockets 16 to power, monitoring the length in time of the power usage by the user, storing the elapsed time of power usage in the user account database, incrementing the elapsed session time to the total elapsed time for the user in the power usage database, declining further power usage when the aggregate lapsed time reaches certain predefined parameters. The user specific power usage parameters may also be reset.

Referring again to FIGS. 1, 4–8, 9A–H, terminal 60 receives a process request via an access tool, which is electronically communicated to computing device. The computing device compares access tool instruction to stored user information in user account database. Computing device retrieves access rights parameters for the user who matches the access tool instruction.

Figure 4:
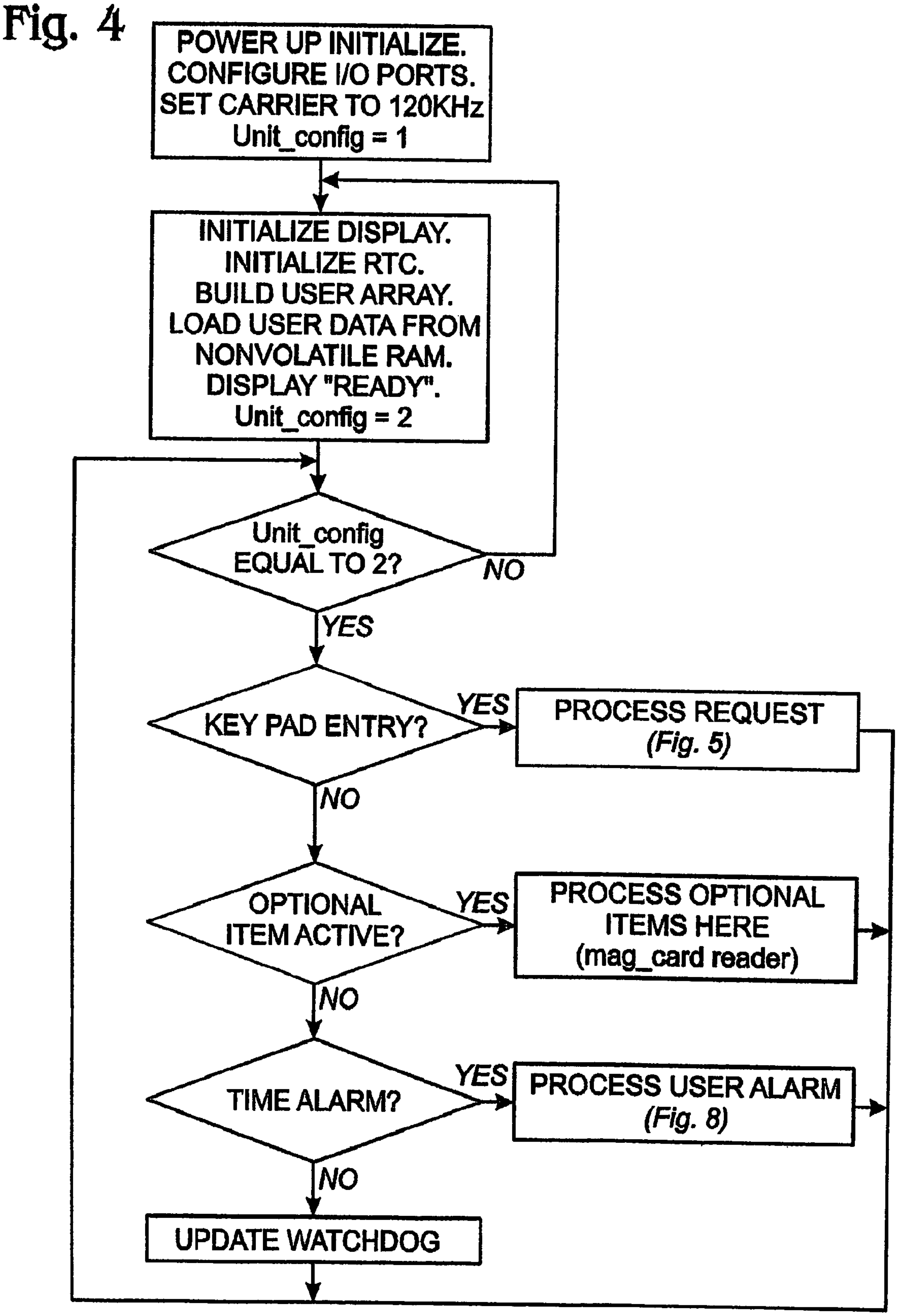
FIG. 4 provides a flow chart for the main processes of the present invention FIG. 5 provides a flow chart for the process request functions of the present invention.
Figure 5:
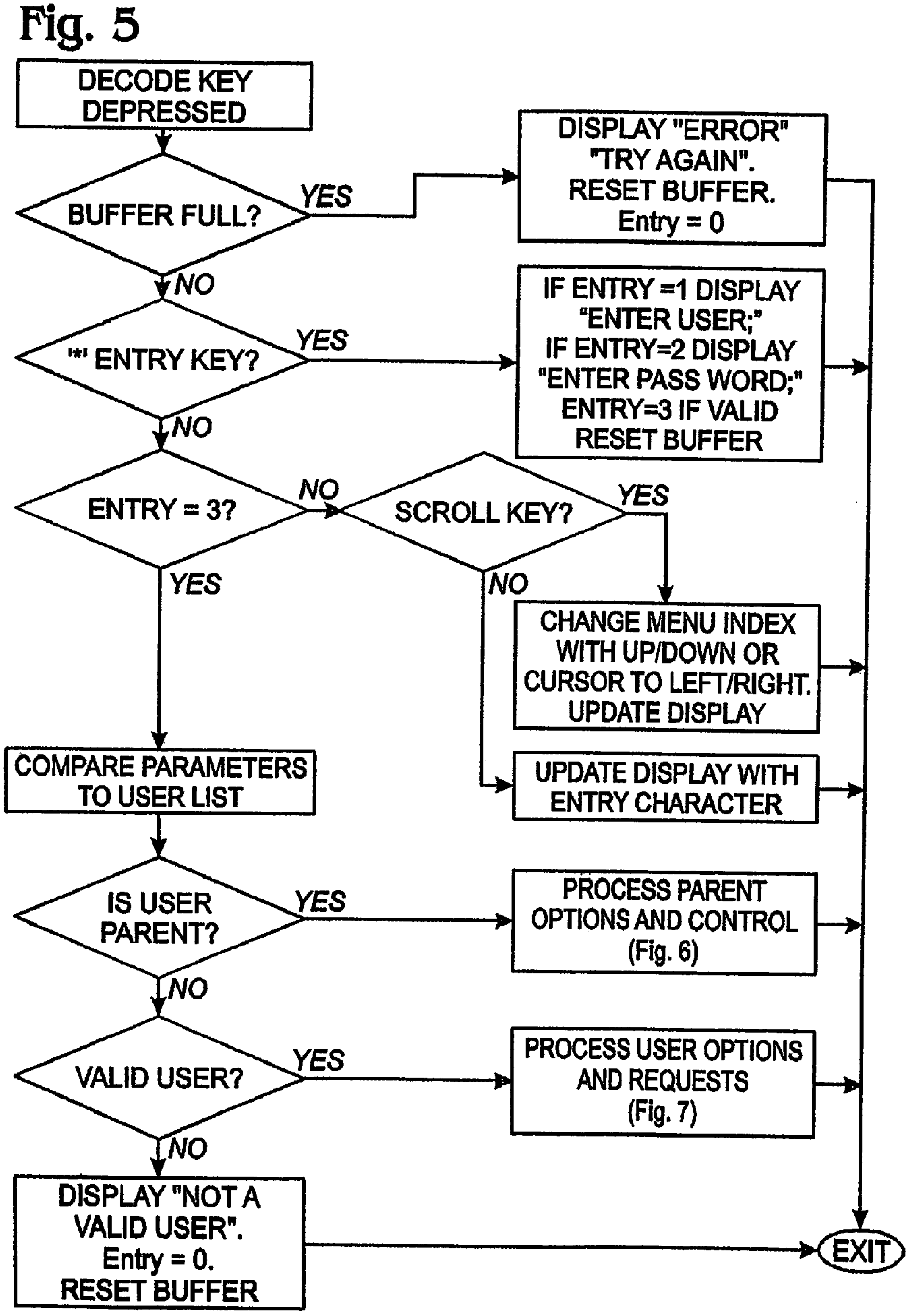

Referring to FIG. 4, the main module coordinates the access tool input with the user database and includes calls for a process request function, a process port option and control function, a process user options and request function, and process user alarm function. The Main Module runs the Terminal and operates as a set of stored instruction, either as hardware or software, on the computing device. Main Module includes calls for a Process Request Function, and Process User Alarm Function Referring to FIG. 5, the process request function includes calling up the user account database, referenced in the drawing as the user list, which comprises a data structure maintaining user account information. Account information includes name, maximum power usage for a specified period of time for a specified power socket port, and elapsed time for the specified period for the specified power socket port for the user. Database can provide further and different fields. Database further includes internal administrative services for maintaining the database information, server cleanup, and server maintenance. The Process Request function receives the access tool input, calls up the user account database, and compares the access tool with the user account database. Where the access tool matches an account, the Process Request Function determines if the user is a superuser who is allowed to enter and alter accounts, a valid user who has a user account but is not allowed to enter and alter accounts, or not a valid user. If the user is a superuser, such as parent, the Process Request Function calls the Process Parent Options and Control Function. If the user is a valid user, the Process Request Function calls the Process User Options and Request Function. IF the user not a valid user, the Process Request Function resets the input to zero and the terminal remains in the receive access tool state.

Figure 6A:
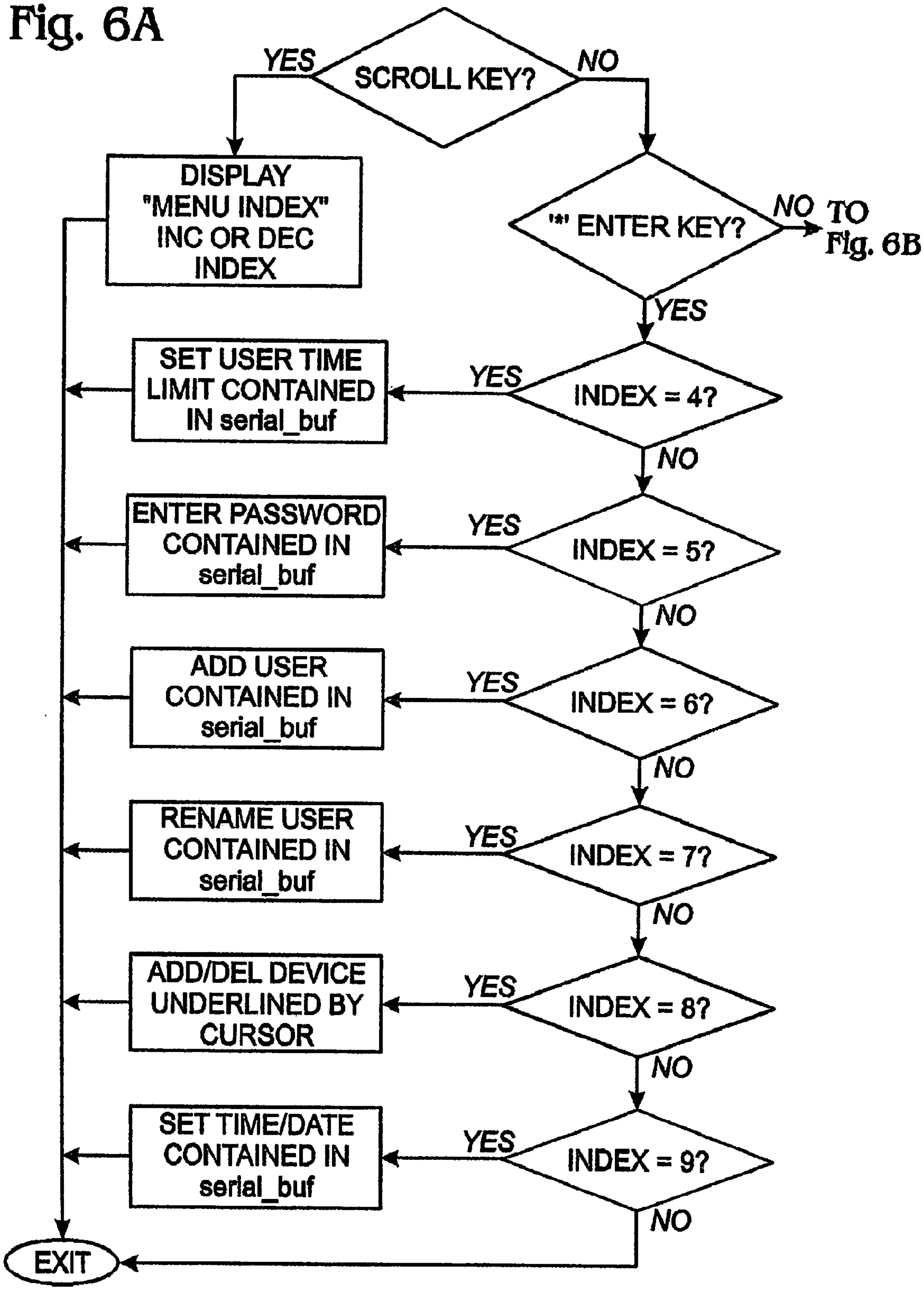
FIGS. 6A and 6B provide a flow chart for the process parent options and control function of the present invention.
Figure 6B:
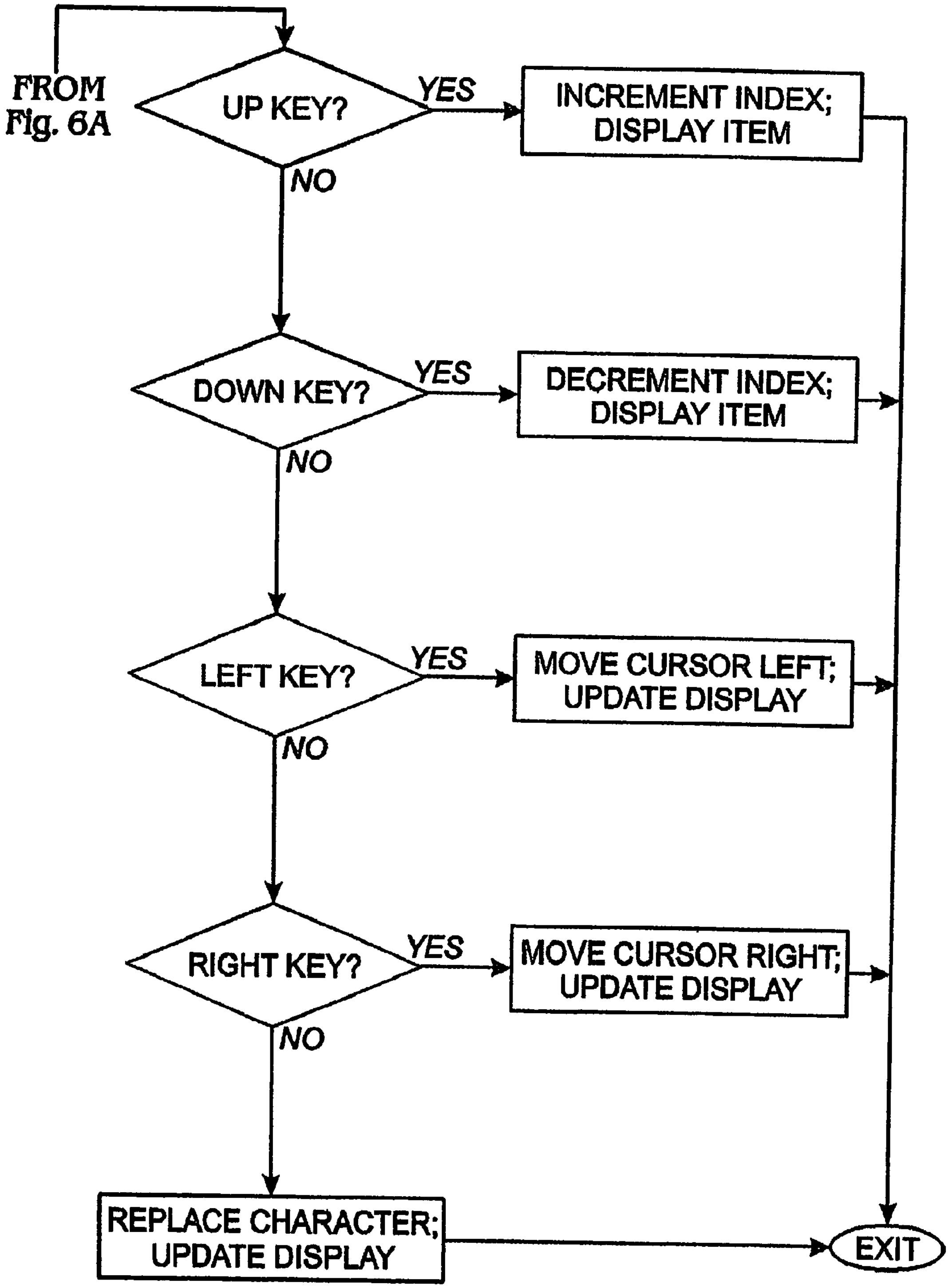

Referring to FIGS. 6*a* and 6*b*, the process parent options and control function includes adding users to the user array, renaming users in the user array, adding and deleting devices for assigned user, setting time limits for devices for the assigned users, and changing the pass words. The Process Parent Option and Control Function allows the superuser to modify the user account database to enter new accounts and set account parameters, to delete accounts, and to change accounts and account parameters.

Figure 7:
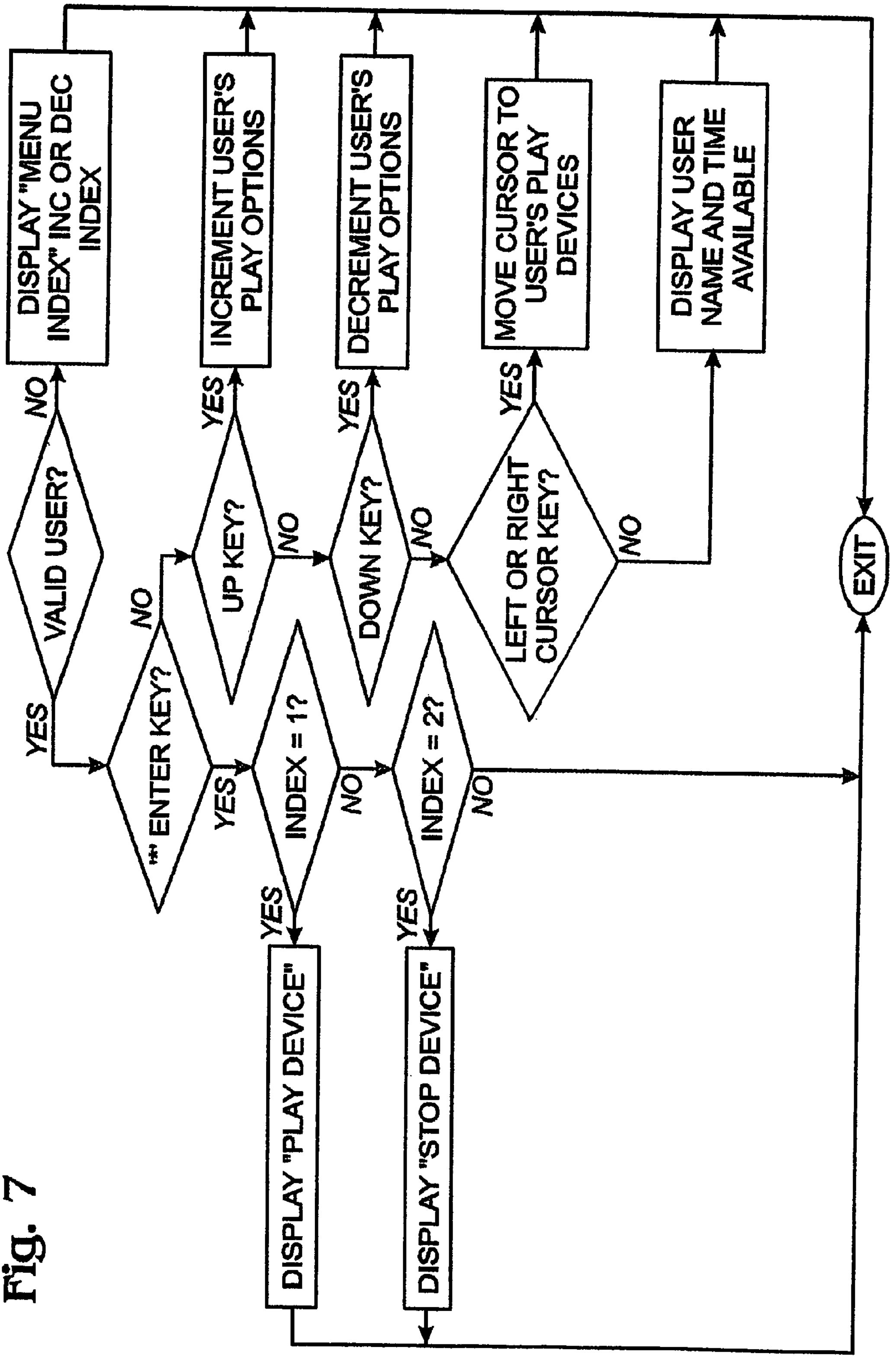
FIG. 7 provides a flow chart for the process user options and requests function of the present invention.

Referring to FIG. 7, the process user options and requests function includes determining whether the device selected is assigned to the user, turning the device on by applying power too it, turning the device off, display the device and the time remaining, and incrementing and decrementing the devices and time remaining for the assigned user. The Process User Options and Request Function allows the valid user to choose which power strip socket port to apply power to. The Process User Options and Request Function monitors the elapsed time on for a particular valid user compared against the parameter in the user account database for the user for maximum time. When the elapsed time nears the maximum time set in the parameter for the user, the Process User Alarm Function is called to alert the user that the session will be terminated.

Figures 8, 9:
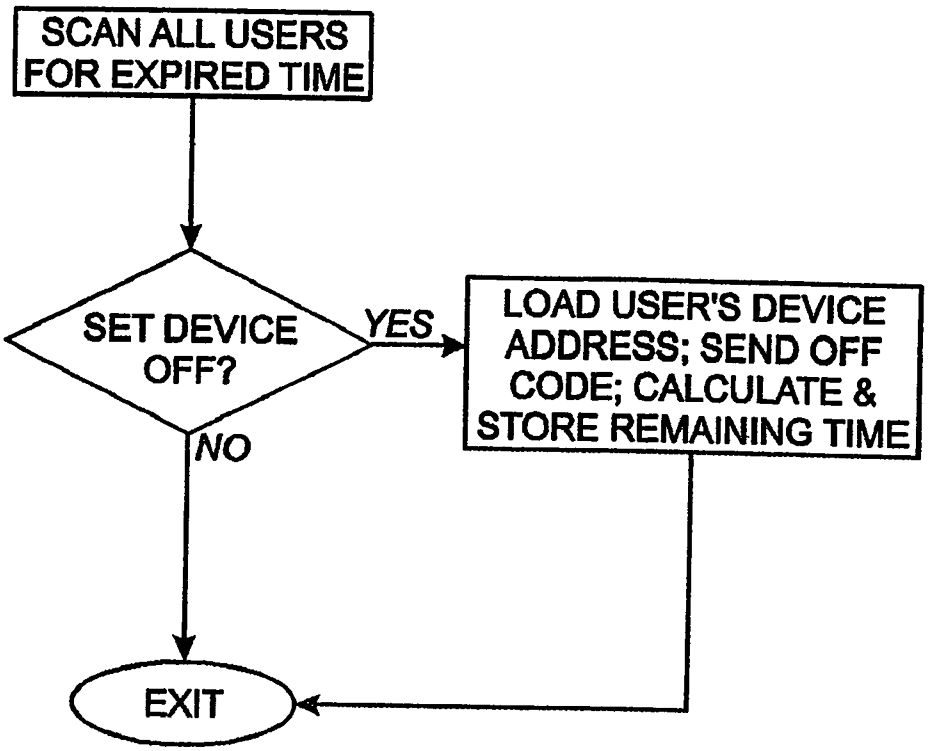
FIG. 8 provides a flow chart for the process user alarm function of the present invention.
FIG. 9, 9A–9H provide an electrical schematic view of a computing device.
Figure 9A:
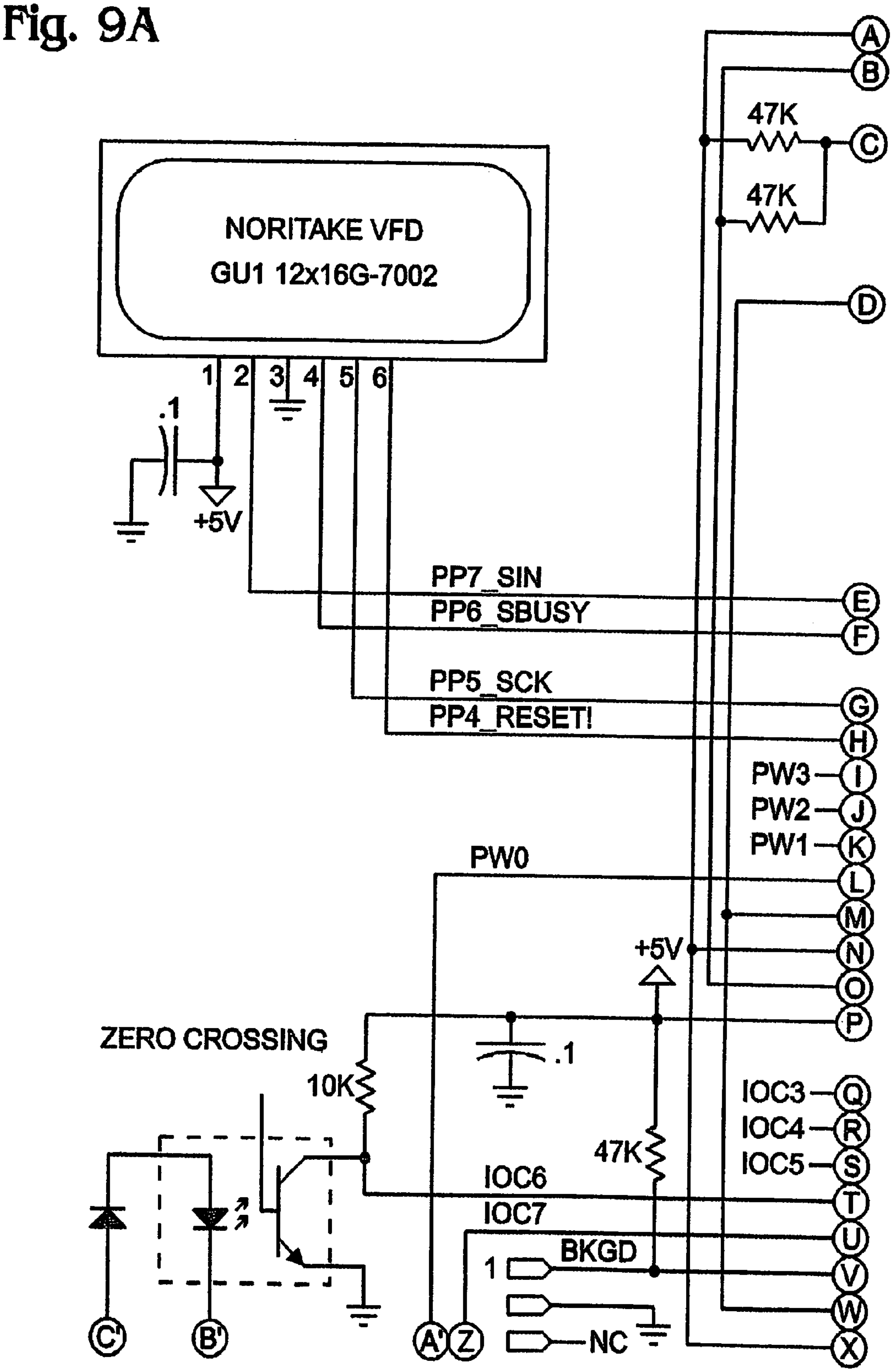
Figure 9B:
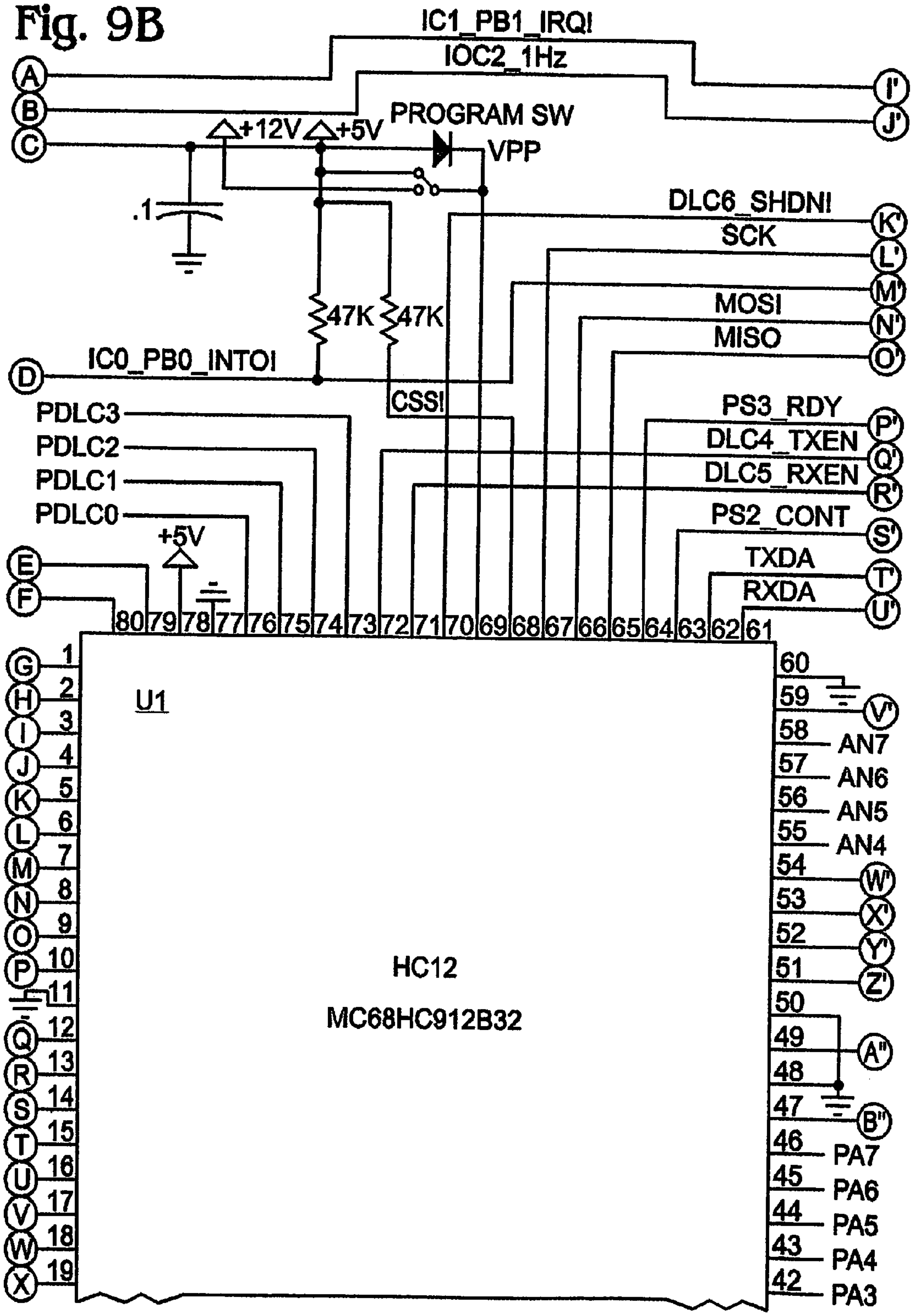
Figure 9C:
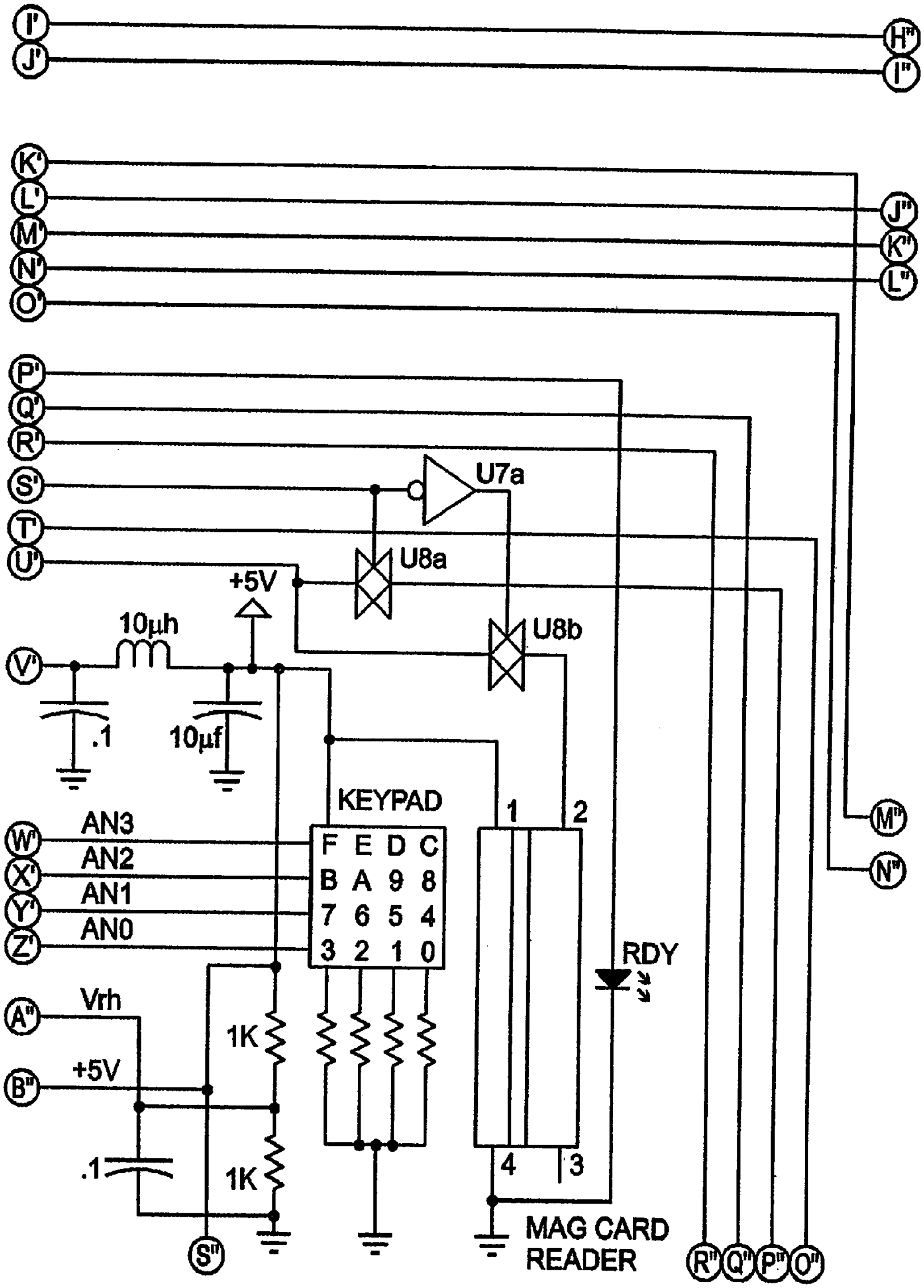
Figure 9D:
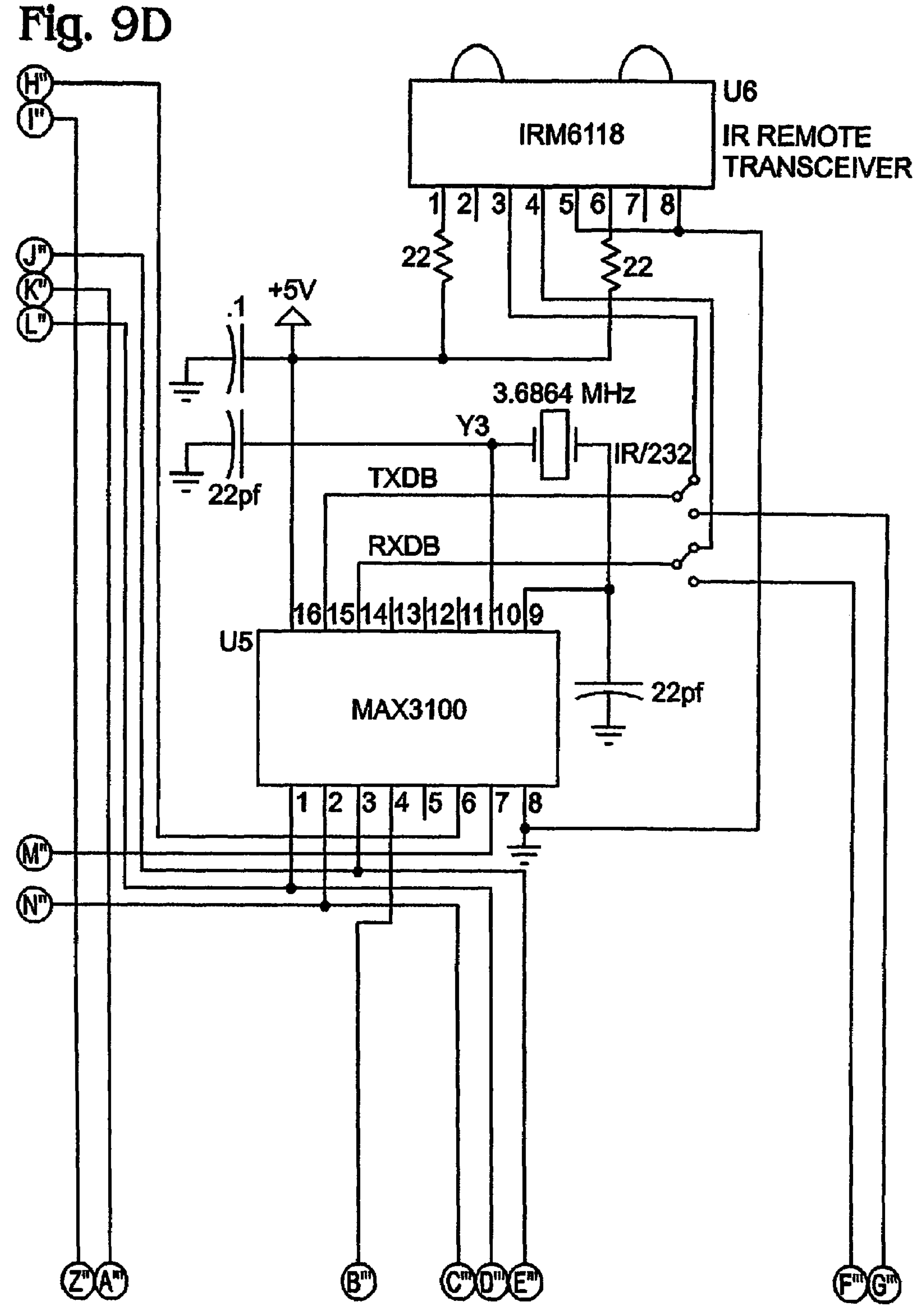
Figure 9E:
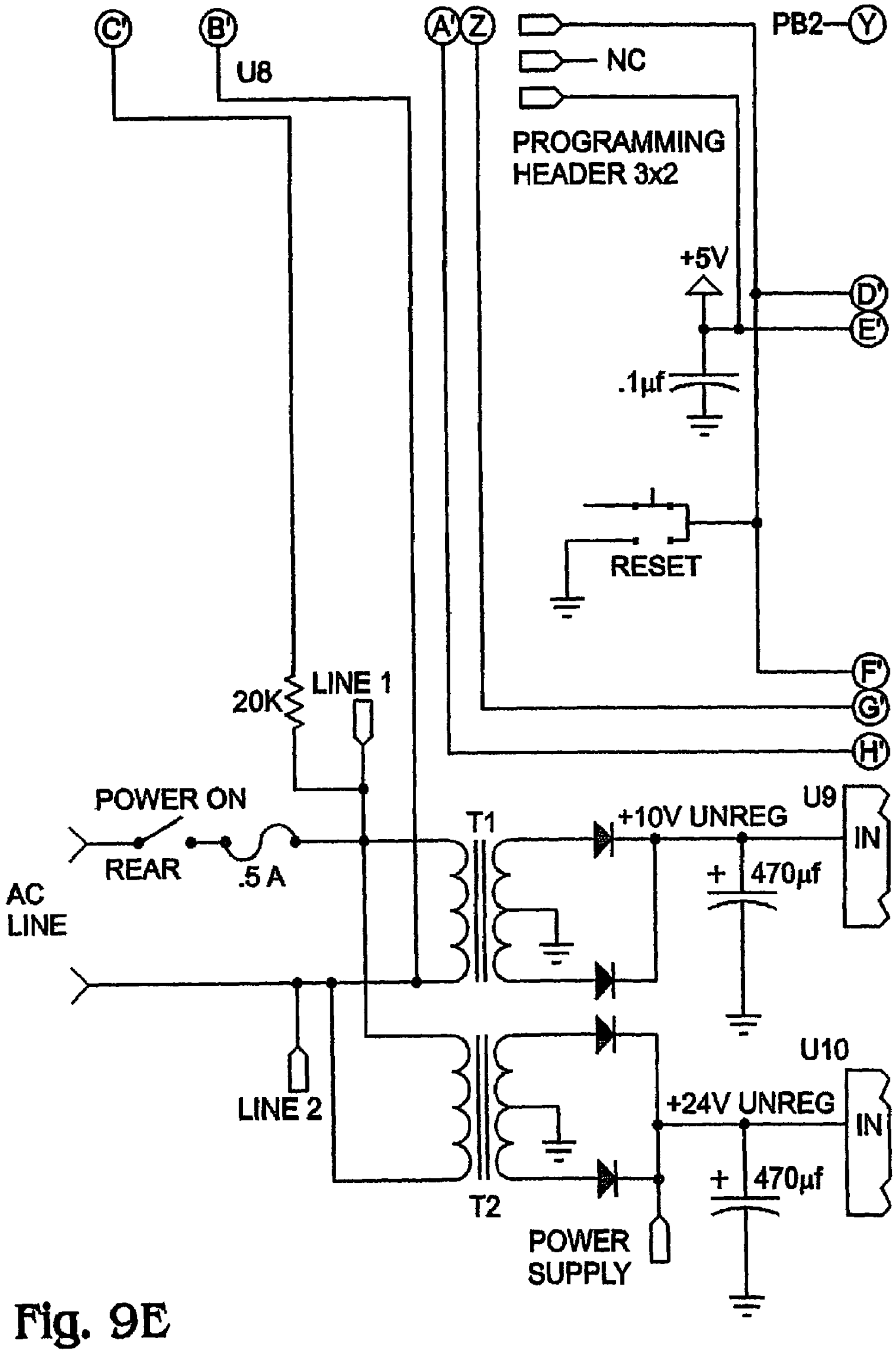
Figure 9F:
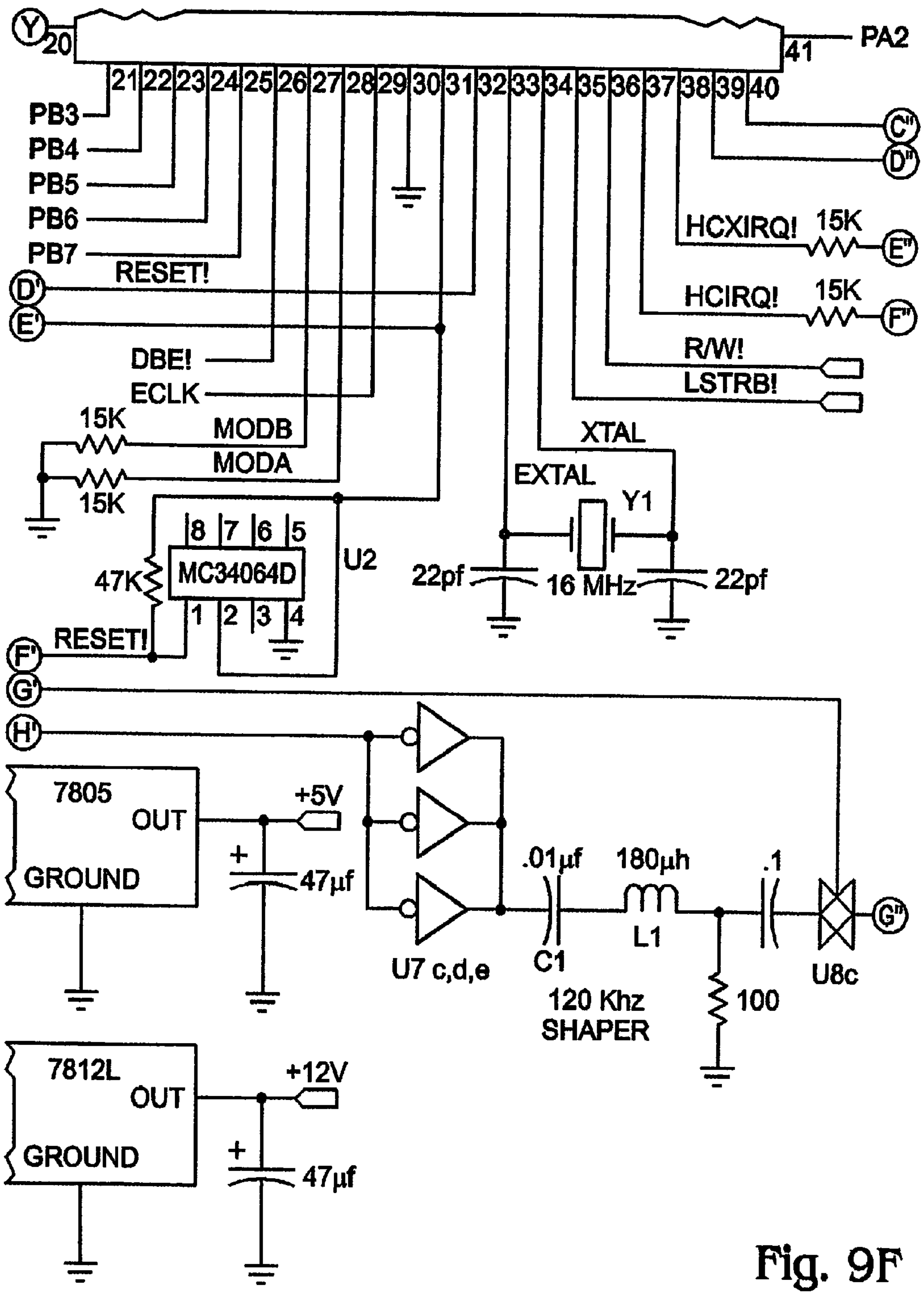
Figure 9G:
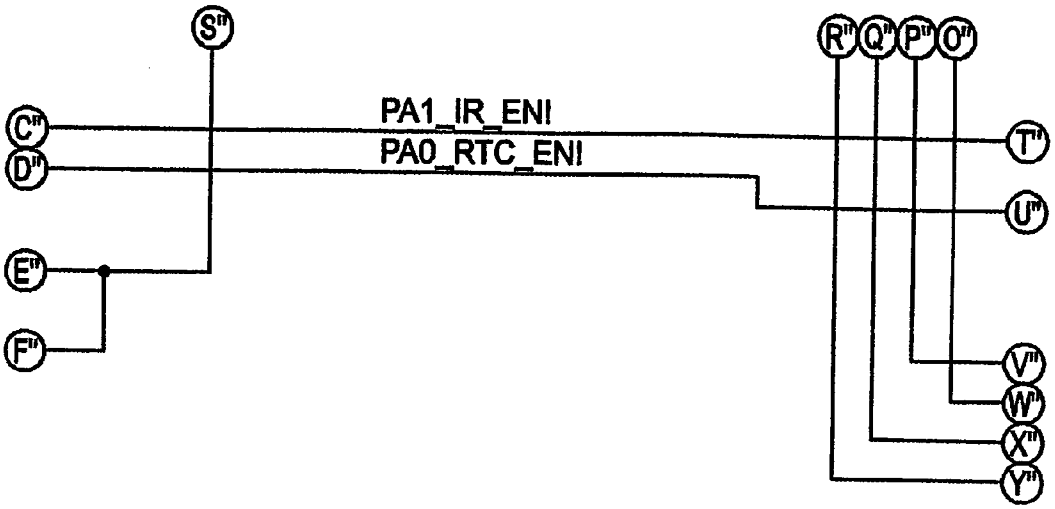
Figure 9G:
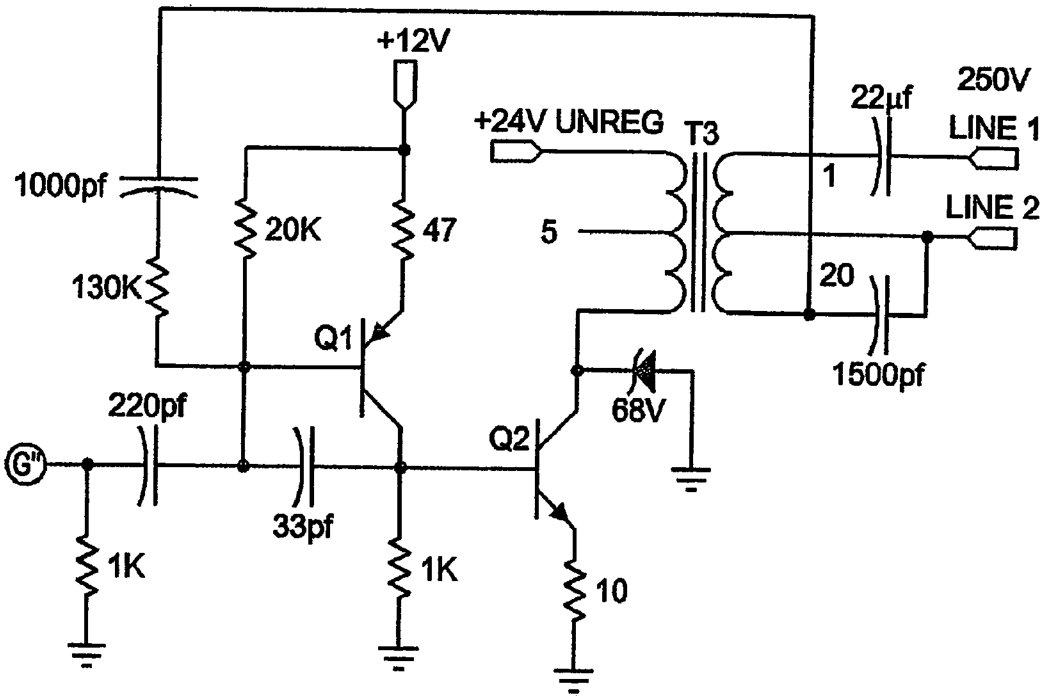
Figure 9H:
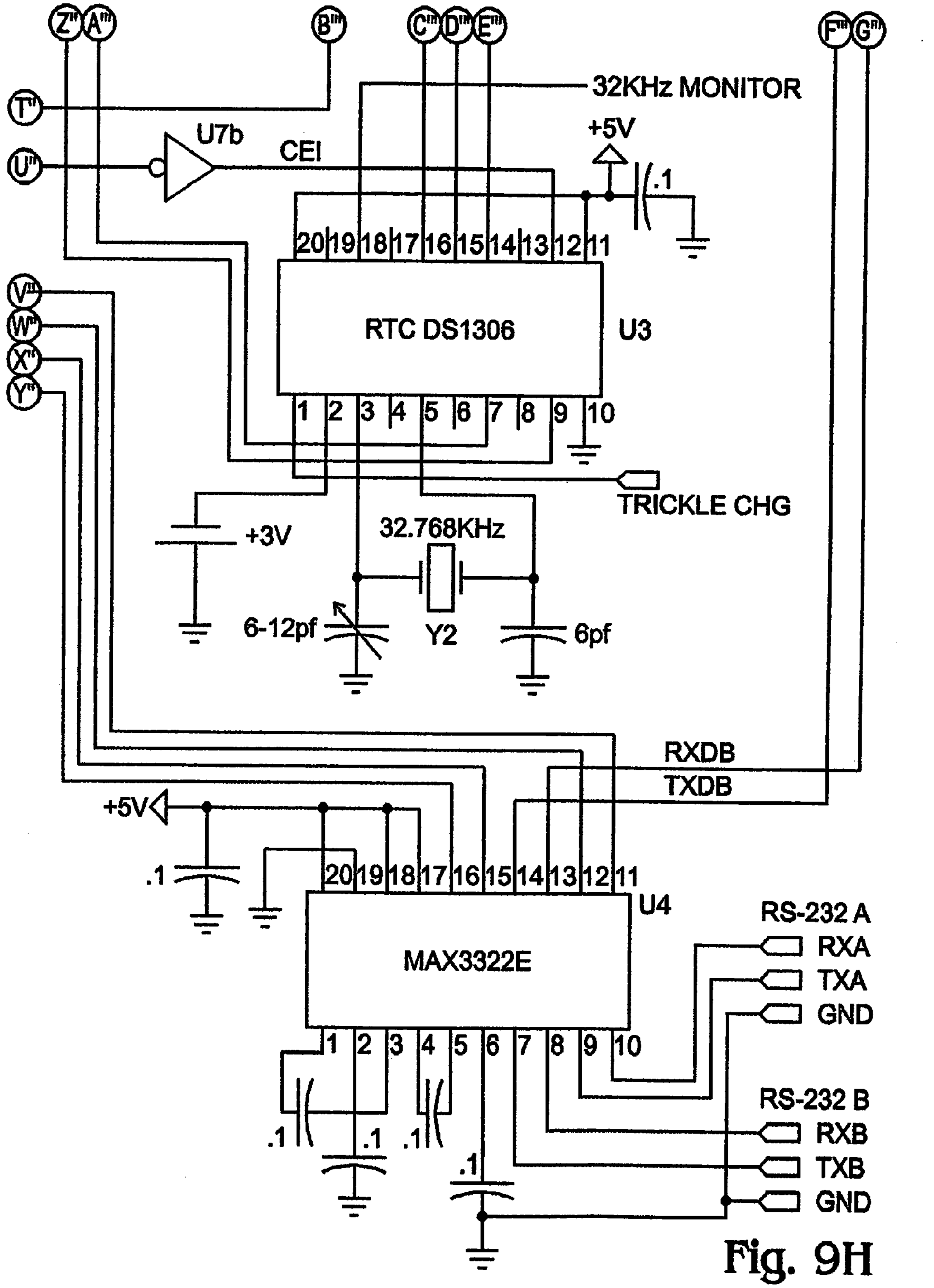

Referring to FIG. 8, the process user alarm function includes providing a warnings at time incrementing when allowed time for a particular device and a particular user is nearly lapsed.

In the preferred embodiment the nonvolatile RAM is EEPROM and retains the user parameters on "power off" conditions. Send commands are the X10 protocol sent over AC lines. As shown in FIG. 1, the key pad K is a standard numeric pad plus Up/Down, L–R Arrow and Enter buttons. The I, II, III, and IV buttons elevate the numeric keys to Alpha numeric characters.

In the Figures, RTC refers to Real Time Clock and the User Array Fields are Password, Name, User Assigned Devices, Time Allowed, and Time Remaining. Devices are addressed 0–15. Warning indicator is assigned by the superuser, such as a parent. The Alarm in a pending event sent by the Real Time Clock. Valid User, Processing, Entry and Parent are indicator flags.

In the preferred embodiment the present invention is implemented as a set of instructions on a computing device preferably having the electrical schmatic as shown in FIGS. 9A–9H, and utilizing a Motorola HC12 chip. In the preferred embodiment, the set of instructions existing on the computing device are stored in the Random Access Memory (RAM). The set of instructions is preferably compiled from C source code, although of course any suitable programming language may be used. The database functions are preferably implemented through any of several database processes well known in the art.

In the preferred embodiment the software engine is a stand alone software product. In the preferred embodiment, the software engine utilizes the C Programming language. In the preferred embodiment, the present invention utilizes outlets capable of X10 communication, preferably outlets in a power strip.

In the preferred embodiment, all communications utilize the X10 communications protocol, the power strip 10 is an X10 based power strip, and the power strip sockets 16 are X10 sockets.

Operation of the Computing Device by the User

As can be seen from FIG. 1, in the preferred embodiment the terminal 60 contains a key pad K, magnetic card reader R and a display D. User swipes pre programmed cards with the users name and a personal identification number (PIN). This number invokes an account for the user contained in a non volatile memory and displays the options available to said user. The user then scrolls the display using the direction arrows and on the key pad selects the desired function and presses the enter key. If for example the user selects the TV set then the display would show hours and minutes available for that selected item. Should there be curfew limits set that would be displayed as a blinking time on an attempt to engage the option otherwise the proper control commands are sent to the power controller and the TV set is turned on.

Other methods of enabling and disabling a device can be done with remote control units of the relay type whereby control is via some other method than AC power interruption. An example would be a computer and disabling of the mouse or keyboard rather than the AC power. There are many methods and are beyond the scope of this document.

Superuser, or parental control, works in a similar manner except that a special access password is required. After entering the password, the superuser has full control of all the functions including the ability to set up user accounts, change user accounts, install time limits on user accounts, increase or decrease time limits on user accounts, and view status reports on user accounts using the display or through a serial link with a separate computer.

As shown in FIGS. 4–8, programming the computing device includes identifying what electrical apparatuses are plugged into what specific outlet sockets and entering specific access-rights and parameters for each user or group of users. The access parameters can include year, month, date, day, time, hour, minutes and fractions thereof, in any combination thereof, for access to one or more power strip ports. Once the computing device 16 has been programmed and the users have received their access tool 18, the user now has access to what could be termed "credit" with the device. The actual use of the credit(s) is now up to the user, to choose how and when to use their credit(s) to apply voltage to the outlet port(s) associated with the device(s) of their choosing. Once the user has used the access tool, the terminal allows the user to choose which power strip ports to have voltage applied to, and for what duration of time. If the user's request is not within the acceptable limits as defined by pre programming then the computing device, based on preprogrammed parameters, will not allow voltage to be applied to the selected ports. The user may then choose to request a differing amount of time or ports or combination thereof.

The method and apparatus also may be practiced in a language and platform independent manner, and be implemented over a variety of scalable server architectures. The method and apparatus of the present invention may be practiced via private individuals on the Internet, businesses operating on a WAN connected to the Internet, businesses operating via private WAN, and so on. There are many customizable situations.

Those skilled in the art will recognize that numerous modifications and changes may be made to the preferred embodiment without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the preferred embodiment is essential. Other embodiments are possible, their specific designs depending upon the particular application. As such, the scope of the invention should not be limited by the particular embodiments herein described but should be defined only by the appended claims and equivalents thereof.

We claim:

1. A point of play terminal, comprising:

a lockable outlet strip connectable to a source of electrical power having one or more electrical sockets which can be selectively energized by switching means;

a computer in electronic communication with said switching means, wherein the state of said switch means is controlled by said computer, said computer comprising a microprocessor, a computer readable medium encoded with software comprising a set of instructions and parameters, and input means for modifying said instructions or parameters.

2. A process for allocating duration of allowed power use for individual power sockets based on identification data in a computer readable medium encoded with a set of instructions, comprising the steps of:

receiving identification data from a user;

comparing the identification data with a user account database to determine amount of power usage allowed to the user;

determining whether the user is allowed power usage;

if the user is allowed power usage, performing the steps of:

allowing the user to choose one or more power outlet sockets to power, monitoring the length in time of the power usage by the user, storing the elapsed time of power usage in the user account database; and incrementing the elapsed session time to the total elapsed time for the user in the power usage database; and declining further power usage when the aggregate lapsed time reaches certain predefined parameters.

3. The process of claim 2, further comprising the step of resetting user specific power usage parameters.

4. An apparatus for allocating duration of allowed power use for individual power sockets based on identification data, comprising:

a computer;

means loaded on said computer for receiving identification data from a user;

means loaded on said computer for comparing the identification data with a user account database to determine amount of power usage allowed to the user;

means loaded on said computer for determining whether the user is allowed power usage;

if the user is allowed power usage, means loaded on said computer for performing the steps of:

allowing the user to choose one or more power outlet sockets to power;

monitoring the length in time of the power usage by the user;

storing the elapsed time of power usage in the user account database; and incrementing the elapsed session time to the total elapsed time for the user in the power usage database; and means loaded on said computer for declining further power usage when the aggregate lapsed time reaches certain predefined parameters.

5. A data processing system loaded with a set of instructions for receiving identification data from a user, comparing the identification data with a user account database to determine amount of power usage allowed to the user, determining whether the user is allowed power usage, it the user is allowed power usage, then allowing the user to choose one or more power outlet sockets to power, monitoring the length in time of the power usage by the user, storing the elapsed time of power usage in the user account database, incrementing the elapsed session time to the total elapsed time for the user in the power usage database, declining further power usage when the aggregate lapsed time reaches certain predefined parameters, comprising;

a computer;

a set of instructions loaded on said computer, said instructions comprising:

instructions for receiving identification data from a user;

instructions for comparing the identification data with a user account database to determine amount of power usage allowed to the user;

instructions for determining whether the user is allowed power usage;

if the user is allowed power usage, instructions for performing the steps of:

allowing the user to select power outlet sockets to power;

monitoring the length in time of the power usage by user;

storing the elapsed time of power usage in the user account database; and incrementing the elapsed session time to the total elapsed time for the user in the power usage database; and instructions for declining further power usage when the aggregate lapsed time reaches certain predefined parameters; and a lockable power outlet ship having one or more power sockets in electronic communication with said computer; and an access terminal in electronic communication with said computer.

6. A point of play terminal, comprising: a storage medium, the storage medium having instructions stored thereon, wherein when the instructions are executed, they result in:

receiving identification data from a user;

comparing the identification data with a user account database to determine amount of power usage allowed to the user;

determining whether the user is allowed power usage;

if the user is allowed power usage, performing the steps of;

allowing the user to select power outlet sockets to power;

monitoring the length in time of the power usage by the user;

storing the elapsed time of power usage in the user account database; and incrementing the elapsed session time to the total elapsed time for the user in the power usage database; and declining further power usage when the aggregate lapsed time reaches certain predefined parameters.

* * * * *